United States Patent [19]

Ketelhohn et al.

[11] Patent Number: 5,290,384
[45] Date of Patent: Mar. 1, 1994

[54] APPARATUS FOR CONTROLLED SPRAY ETCHING

[75] Inventors: Karl F. G. Ketelhohn; Donald F. Ball, both of State College, Pa.

[73] Assignee: Chemcut Corporation, State College, Pa.

[21] Appl. No.: 60,759

[22] Filed: May 12, 1993

Related U.S. Application Data

[62] Division of Ser. No. 788,929, Nov. 7, 1991, Pat. No. 5,228,949.

[51] Int. Cl.$^5$ .......................................... H01L 21/00
[52] U.S. Cl. .................................. 156/345; 156/640; 156/664; 118/316; 118/684; 118/669
[58] Field of Search ............... 156/345, 640, 664, 666; 118/316, 684, 669

[56] References Cited

U.S. PATENT DOCUMENTS

| | | | |
|---|---|---|---|
| 3,808,067 | 4/1974 | Brown | 156/640 |
| 4,126,510 | 11/1978 | Moscony et al. | 156/640 |
| 4,352,994 | 10/1982 | Inzoli et al. | 156/345 |
| 4,397,708 | 8/1983 | Frantzen | 156/640 |
| 4,662,976 | 5/1987 | Hömüller | 156/640 |
| 4,741,798 | 5/1988 | Haas | 156/626 |
| 4,985,111 | 1/1991 | Ketelholm | 156/640 |
| 5,002,627 | 3/1991 | Scheithauer et al. | 156/345 |
| 5,228,949 | 7/1993 | Ketelhohn et al. | 156/640 |

FOREIGN PATENT DOCUMENTS

| | | |
|---|---|---|
| 59007363 | 10/1976 | China . |
| 52-007340 | 1/1977 | Japan . |
| 59-076878 | 5/1984 | Japan . |
| 59-76879 | 5/1984 | Japan . |
| 62-202087 | 9/1987 | Japan . |
| 1-132780 | 5/1989 | Japan . |
| 1-205084 | 8/1989 | Japan . |
| 2-090600 | 3/1990 | Japan . |
| 2-153081 | 6/1990 | Japan . |
| WO8502630 | 6/1985 | PCT Int'l Appl. . |

OTHER PUBLICATIONS

"Photocell Controlled Etchen",-IBM Technical Disclosure Bulletin; vol. 10; No. 5; Oct. 1967; pp. 582–584 Greene et al.
Japanese Abstract 59-93881 (in English) for Application No. 57-202505.
Hollmuller PCP System Technology.
Aetztechnik Fuer Feinstleiter.
Fine-Line Etching.
Hollmuller Fine-Line Etching.

*Primary Examiner*—Tom Thomas
*Assistant Examiner*—George A. Goudreau
*Attorney, Agent, or Firm*—Paul and Paul

[57] ABSTRACT

An apparatus is provided for controlled spray etching, in which panels, such as printed circuit boards are delivered through an etching chamber, to have a spray etchant sprayed generally on upper and lower surfaces of the panel. The spray is controlled such that a reduced amount of etchant is provided on the perimeter surface portions of the panel, relative to the central surface portions of the panel, transversely of the path of travel of the panels through the etching chamber. The spray may be varied in amount, preferably by varying the pressure at different locations transversely of the chamber; the spray longitudinally through the chamber, may vary, to spray leading and trailing surface portions of the panels a lesser amount than central portions of the panels, measured longitudinally. The control of the spray of leading and trailing surface portions of the panels may be facilitated by one or more sensors that control an intermittent discharge of spray etchant near the inlet to the etch chamber.

9 Claims, 3 Drawing Sheets

APPARATUS FOR CONTROLLED SPRAY ETCHING

CROSS-REFERENCE TO RELATED APPLICATIONS

This is a divisional of application Ser. No. 788,929 filed Nov. 7, 1991, now U.S. Pat. No. 5,228,949.

BACKGROUND OF THE INVENTION

In the course of the manufacture of many articles, including printed circuit boards, the boards, printed circuit film, or other panels are generally delivered along a preferably horizontal path, while being horizontally disposed, as they pass through a chamber in a longitudinal direction from inlet to outlet. During the course of such delivery, and particularly with respect to printed circuit boards, film and the like, it has become commonplace to etch surface portions of the panels, or boards, removing metallic material from the upper and lower surfaces thereof. Generally, such metallic material is copper, and the etchant can be any of various etchants capable of removing metallic material from surfaces of the boards.

As such boards or panels traverse an etching chamber, from inlet to outlet, it has been noticed that, because etchant is being dispersed on the boards from various spray nozzles, often with fairly uniform application of etchant, there is a tendency for perimeter surface portions of the panels to become etched to greater depths than central surface portions of the panels. It is believed that this phenomena is due to upper and lower panel surfaces generally seeing more etchant at their perimeters than at central surface portions, as a result of flow of etchant from central surface portions outwardly over edges, such that the perimeter or edge portions of the panels receive not only the spray that is impinged directly thereon, but also etchant that was sprayed onto central surface portions of the panels and which runs across the perimeter portions of the panels, as it leaves the panels by travelling over perimeter edges.

In instances in which the depth of metal on panel surfaces is of minimal thickness, more greatly etched perimeter surface portions of the panels may result in an undesirable depth of metal being etched from the panels, leaving the metal surface portions at the perimeters of the panels too greatly etched, or having insufficient metal thereon, for proper subsequent uses, such as for proper carrying of electrical signals, or the like, especially in instances when the panels are printed circuit boards.

SUMMARY OF THE INVENTION

The present invention is directed to controlling the amount of etching that is effected as panels are delivered through an etching chamber, such that perimeter surface portions of the panels are sprayed with less etchant than more central surface portions of the panels.

The invention is especially beneficial when etchant that is delivered to more central surface portions of the panels flows across perimeter surface portions of the panels, because with this invention the net result will be greater control over the etch depth throughout panel surfaces, or a more uniform amount of resultant etching across a panel surface, with lesser variation between central and perimeter surface portions of the panels.

Accordingly, it is a primary objection of this invention to provide increased control of spray etching of panels.

It is a further object of this invention to accomplish the above object by delivering a reduced amount of etchant to side surface portions of panels relative to the amount of etchant delivered to central surface portions of the panels.

It is a further object of this invention to accomplish either the above objects, by delivering a reduced amount of etchant to leading and trailing surface portions of panels relative to the amount of etchant delivered to central surface portions of the panels.

It is a further objection of this invention to accomplish any of the above objects, by providing a lower pressure of spray etchant to outer spray nozzles relative to the pressure of spray etchant that is provided to inner spray nozzles, transversely of the etching chamber.

It is a further objection of this invention to accomplish any of the above objects, by intermittently delivering spray etchant through first spray nozzles at the inlet of the etching chamber, relative to the delivery of spray etchant through other nozzles as a panel passes through the etch chamber.

It is yet another object of the present invention, to accomplish a number of the above objects, wherein intermittent delivery of spray etchant is dictated by sensors sensing the presence of a panel and responsively operating certain nozzles to deliver less etchant to leading and trailing surface portions of panels as panels pass through the etching chamber.

Other objects and advantages of the present invention will be readily apparent to those skilled in the art from a reading of the following brief descriptions of the drawings figures, the detailed descriptions of the preferred embodiments, and the appended claims.

BRIEF DESCRIPTIONS OF THE DRAWING FIGURES

FIG. 1 is a schematic longitudinal sectional view taken through a spray etch chamber in accordance with this invention, wherein panels are illustrated passing from left to right through an etching chamber, and wherein a means is illustrated for delivering and controlling etchant to panels passing through the chamber FIG. 2 is a schematic horizontal view, taken of some of the etchant delivery apparatus illustrated in FIG. 1, generally along the line of II—II thereof, and wherein a mechanism is schematically illustrated for oscillating the nozzles which deliver the etchant spray.

DETAILED DESCRIPTIONS OF THE PREFERRED EMBODIMENTS

Figure 1:
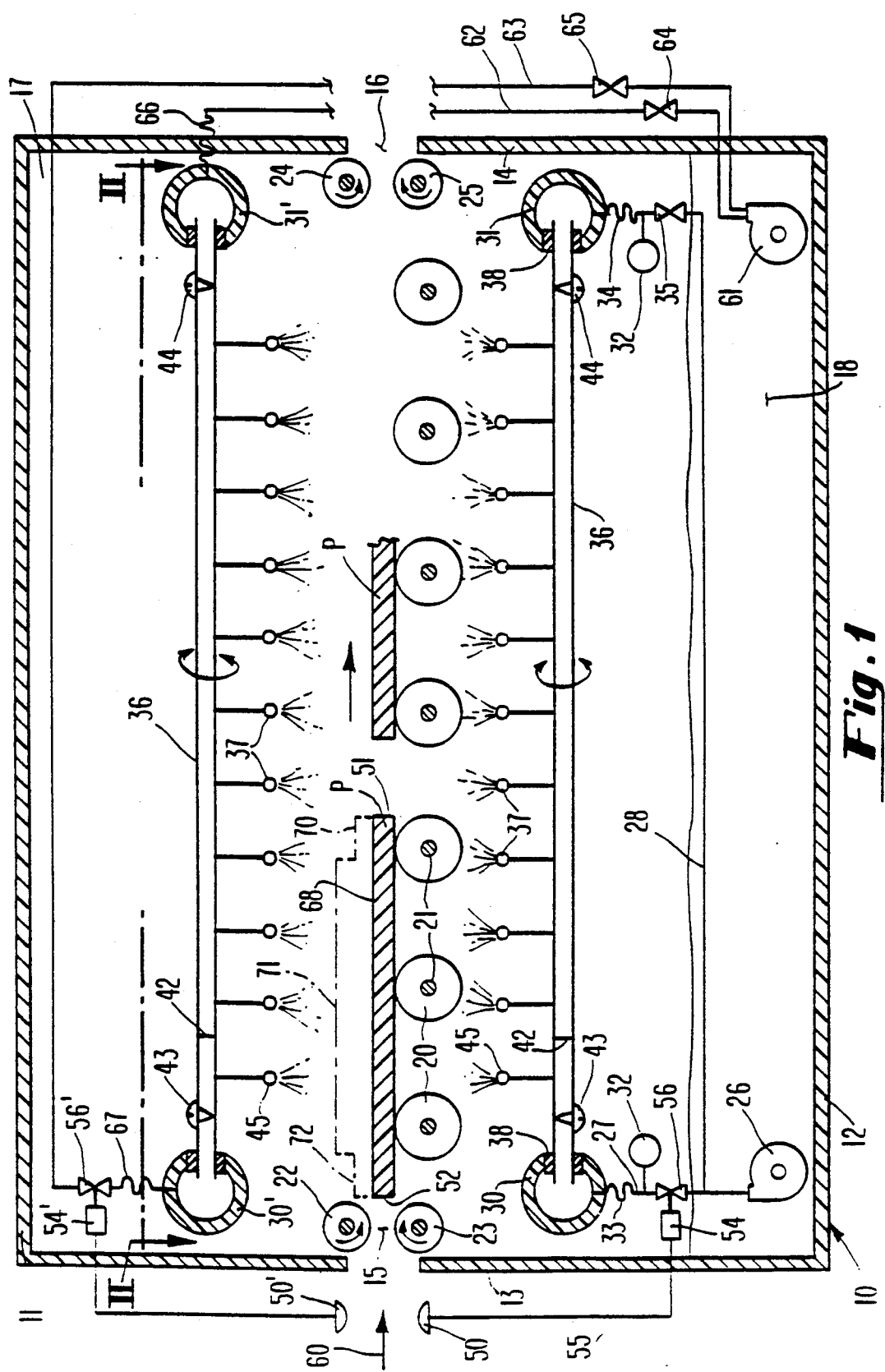

Referring now to the drawings in detail, reference is first made to FIG. 1, wherein the apparatus of this invention is generally designated by the numeral 10, as comprising an etching chamber. The chamber 10 has top and bottom walls 11,12, respectively, and left and right end walls 13 and 14, with openings therein defining inlet and exit openings 15,16, respectively, for passage of panels P therethrough along their path of travel through the chamber 10. The chamber is provided with a far side wall 17 and a near side wall (unnumbered and not illustrated) spaced transversely of the chamber 10, such that all the walls together define a substantially confined etching chamber 10, as illustrated. It will be understood that a level of etchant 18 will generally exist at the bottom of the chamber 10, above bottom wall 12.

As panels P are delivered through the chamber 10, they are driven therealong by a plurality of wheels 20, each mounted on rods 21, which rods 21 extend transversely of the apparatus 10 between near and far walls. The rods 21 are rotatably driven by any suitable means, such as by the drive arrangement of U.S. Pat. No. 4,015,706, the complete disclosure of which is herein incorporated by reference.

Inlet and outlet rollers 22,23,24 and 25 are provided in pairs, at the inlet 15 and outlet 16 of the chamber 10, for limiting the passage of etchant spray outwardly of the chamber. Such rollers may be constructed like inlet and outlet rollers as shown in U.S. Pat. No. 4,999,079, or as disclosed in U.S. Pat. No. 5,007,968, or in any other manner, within the scope of the present invention. The complete disclosure of both said patents are herein incorporated by reference.

Etchant 18 from the bottom of the tank 10 is delivered via a pump 26, via delivery lines 27 and 28, to respective lower manifolds 30,31. The etchant 18 can be, e.g. that disclosed in U.S. Pat. No. 4,233,106, the complete disclosure of which is incorporated by reference, or any other etchant. Suitable pressure gauges 32 may be utilized to check the pressure(s) being delivered to respective manifolds 30,31. The delivery lines 27,28 will have flexible portions 33,34, to facilitate transverse movement of the manifolds 30,31, within the chamber 10, as will hereinafter be described.

Line 20 will have a suitable preferably manually settable valve 35. The manifolds 30,31 are constructed as generally hollow pipes, feeding a plurality of generally horizontally disposed etchant supply lines 36. Opposite ends of the etchant supply lines 36 for delivering spray etchant to spray nozzles 37, are connected to the manifolds 30,31 at opposite ends, for pivotal movement therein, via bushings 38 which permit pivotal movements of supply lines 36 relative to the manifolds 30,31, while sealingly maintaining etchant supply from the manifolds 30,31 to the lines 36, via the bushings 38.

Each supply line 36 has an inlet zone 40 and a remainder zone 41, blockingly separated from each other by means of line blockages 42 (which may be closed valves or the like, if desired), whereby etchant in zone 40 and etchant in zone 41 may not communicate with each other. A throttling mechanism, such as a needle valve 43 or the like, is provided in line zone 40, for controlling the pressure and amount of etchant delivered to a first spray element 45, nearest the inlet 15, in each such supply line 36.

It will thus be seen that the first spray nozzles 45 are provided with etchant from the manifold 30 nearest the inlet, while the remaining spray nozzles 37 in line 36 are provided with etchant from manifold 31. Pumps, such as that 36 may be disposed in the chamber like that disclosed in U.S. Pat. No. 4,985,111, the complete disclosure of which is herein incorporated by reference, or in any other manner.

The delivery of etchant to spray nozzle 45 may be intermittently controlled by means of a sensor 50 at the inlet 15, for sensing the presence of a leading edge 51 or trailing 52 edge of the panel P and actuating a solenoid 54 via electrical control line 55, which in turn will control the operation of the solenoid valve 56, for dictating the intermittent discharge of etchant from each nozzle 45, depending upon a pre-set pattern, such that a leading lower surface portion will not receive etchant until it has passed nozzle 45, whereupon the sensor 50 will allow etchant to be delivered via nozzle 45 over the lower central surface portion of the panel P, followed by the discontinuance of delivery of etchant from nozzle 45 as a trailing lower surface portion of the panel P passes above the nozzle 45, all as determined by pre-setting of solenoid 54 and its valve 56, and as determined by the setting of the recognition sensor 50. Preferably, such pre-setting of sensor/solenoid valving will be predetermined based upon the length of the panel P. Thus, from a given supply line 36, portions of the panel P that are etched thereby, will be etched for a longer period of time by spray from nozzles 37, than for spray from nozzles 45.

The settings of the various needle valves or the like 43, transverse of the apparatus 10, may likewise vary, such that the valves closest to the sidewalls (such as sidewall 17) may be set to deliver etchant at a lower pressure than other supply lines 36 more toward the interior of the apparatus 10.

It will be apparent that valves 43 that are not adjacent near or far sides of the apparatus 10 may all be set for delivery of etchant at the same pressure, or such may vary, such that all zones 40 of lines 36 transverse of the apparatus 10 deliver at different pressures, with generally the lower pressures in zones 40 closest to the sidewalls of the apparatus.

Similarly, the needle valves or other throttling means 44 that control the pressure of etchant delivered to zones 41 of supply lines 36, may vary for different lines 36 across the machine, such that intermediate such zones 41 across the machine may all be at the same pressure, with the zones 41 closest to sidewalls at a different, lower pressure, or all such zones 41 may vary across the machine, with the lower pressures being in the ones closest to the sidewalls Preferably, such throttling means 43,44 will be pre-set based upon the expected transverse widths of the panels p While the description above for controlling the delivery of etchant at different locations across the apparatus, and longitudinally of the apparatus, such that a printed circuit board or other panel P passing through the apparatus 10 will have etchant delivered at transversely spaced-apart perimeter zones at less pressure than central zones as viewed transversely of the apparatus, and longitudinally will have a controlled, intermittent delivery of etchant between leading, central and trailing surface portions on the lower surface of the panel P, there will be thus be a control of the amount of etchant spray that is provided along perimeter portions of lower surfaces of the panels as they pass from inlet 15 to outlet 16 of the apparatus.

The above-described system for delivery of etchant to a lower surface of the panel P is substantially identical to that portion of the system for delivery of etchant to an upper surface of the panel P, except that the etchant delivered to the upper surface portions of the panel P travels via manifolds 30' and 31'. Other components, such as supply lines 36, zones 40,41, fluid blockage elements 42, throttling devices 43,44, inlet end nozzles 45, remaining nozzles 37 for zones 41, all function similarly to that described for the lower spray arrangement, in providing an upper spray arrangement for delivering etchant to upper surface portions of panels P travelling along their path from left to right through the apparatus, in the direction of the arrow 60 illustrated in FIG. 1. Accordingly, such similar components need not be duplicatively described herein. However, a pump 61 in etchant 18 delivers etchant via suitable supply lines 62,63 through appropriate respective valves 64,65, through respective flexible lines 66,67, to respectively associated manifolds 31′,30′. In line 63, a solenoid 54′ controls a valve 56′, as dictated by a panel sensor 50′, similar to the process described above with respect to etchant control for the lower surface of the panel P, except that such supplies etchant control for the upper surface of the panel P.

In FIG. 1, there is diagrammatically illustrated in phantom at the upper surface 68 of a panel P, the change in amount of etchant that is delivered from nozzles 45,37 on the upper surface 68 of the panel P, as representing a first amount of etchant that is delivered to a leading upper surface portion 70, a greater amount delivered to a central upper surface portion 71, and, again, a lesser amount delivered to a trailing upper surface portion 72.

Figure 2:
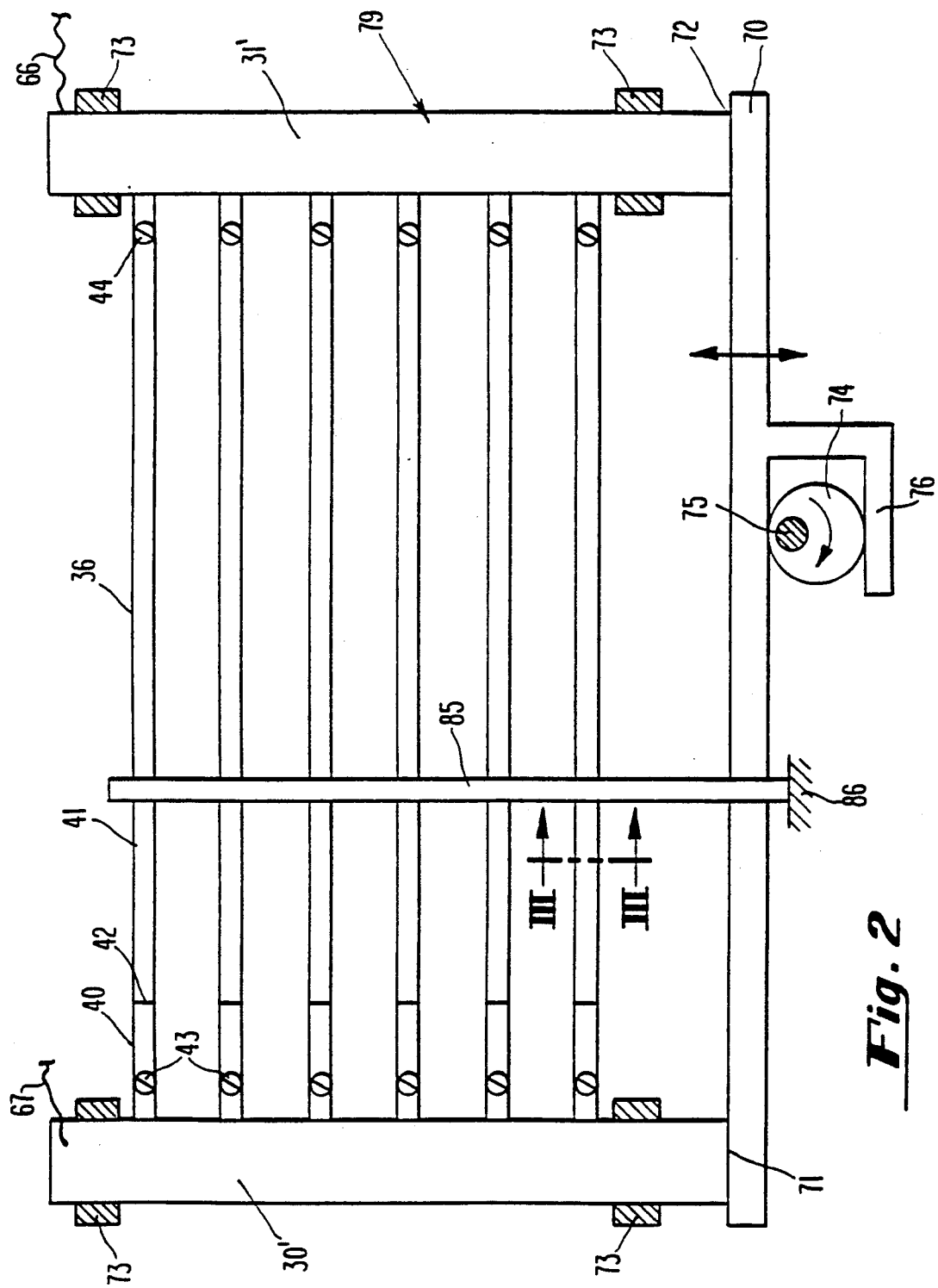
Figure 3:
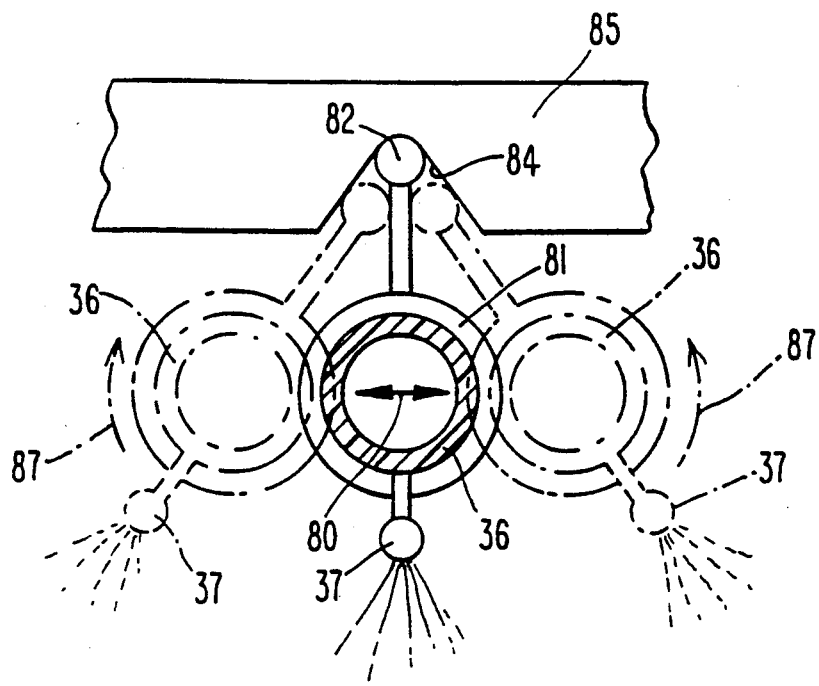
FIG. 3 is an enlarged fragmentary vertical sectional view through one of the etchant delivery lines in accordance with this invention, being taken along the line III—III of FIG. 2, and wherein the nozzle oscillation is illustrated.

With reference now to FIGS. 2 and 3, it will be apparent that the nozzles 45,37 may be oscillated back and forth, such that their angular orientation may vary, and such that the orientation of spray being delivered to the panels P may vary as the panels traverse from inlet 15 to outlet 16 through the apparatus. In this regard, it will be seen that the manifolds 30′,31′ are structurally mounted on a traverse drive bar 70, as at 71,72. The manifolds 30′,31′ are slidably disposed in suitable bushings, to slidably move relative to the bushings 73, as determined by an eccentric wheel 74, that in turn is carried and rotatably driven on a driven shaft 75, that is captured between the bar 7 and a bar leg 76.

Thus, the manner in which the entire carriage including the oscillating bar and manifolds 30′,31′, and their associated supply lines 36 moves, is that a motor (not shown) rotates one or more shafts 75 (with only one being shown in FIG. 2) which in turn, rotates an eccentric cam 74, to drive between members 70 and 76, in captured relationship, such that with the rotation of the shaft 75, the entire carriage moves transverse of the apparatus. In doing so, and with specific reference to FIG. 3, the supply lines or pipes 36 move transversely backward and forward in the direction of the double-headed arrow 80, carrying spray nozzles, such as 45,37 therewith. However, because the supply lines 36 are mounted for rotation in bushings 38, as described above, they are movable relative thereto. Clamps 81 clampingly engage around outer surfaces of supply lines 36, with each clamp 81 having an upper end 82 as illustrated in FIG. 3, being received within a slot 84 in a bar 85 that in turn is fixedly positioned against movement at 86 (FIG. 2), such that, with upper end 82 being captured in chamferred slot 84, and with the supply lines 36 moving as illustrated by arrow 84, the supply lines 36 are not only moved between the phantom positions illustrated therefor in FIG. 3, but the nozzles 45,37 carried thereby are arcuately oscillated as shown by the arrows 87 in FIG. 3, to allow a change in the points of emanation or discharge of etchant from nozzles 37,45, such that not only the angle of etchant changes, but also the placement of its points of discharge. Such an oscillation or back-and-forth movement of the carriage generally designated 79 in FIG. 2, thereby allows a more uniform distribution of etchant transversely of the apparatus 10, prior to the control as provided by this invention.

Figure 4:
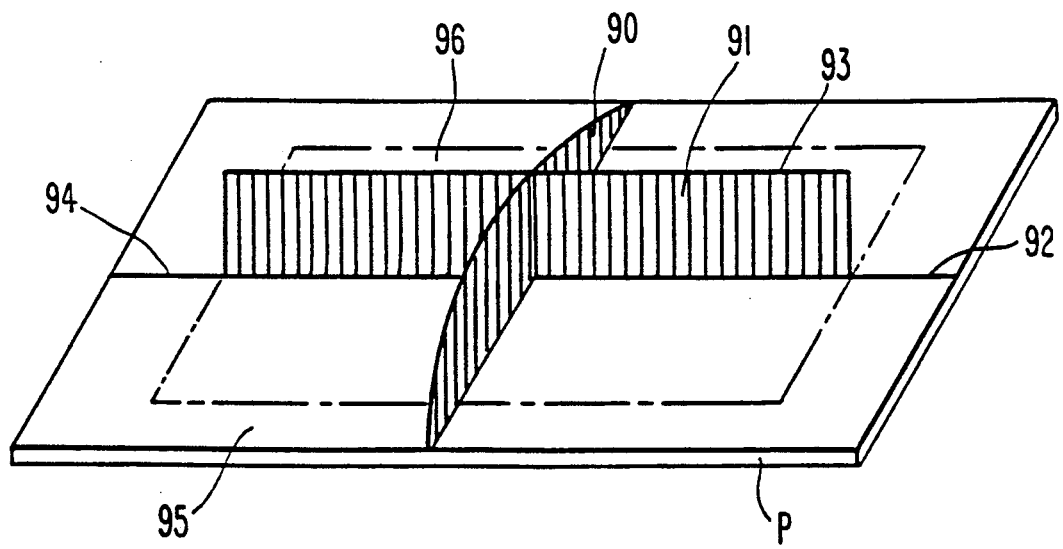
FIG. 4 is a top perspective view of a panel that is etched in accordance with the present invention, and wherein transverse and longitudinal etchant delivery profiles are schematically illustrated thereon.

With specific reference to FIG. 4, there is illustrated a panel P with a transverse schematic 90, representing variations in amount of etchant delivered transverse of the panel P, to correspond with variations in amount of etchant delivered from the various ones of the supply lines 36. Also depicted in FIG. 4 is a schematic illustration representing variations in amount of etchant delivered longitudinally of a longitudinal center portion of the upper surface of the panel P, in the form of no etchant being delivered on a leading perimeter surface portion 92, with a generally uniform level of etchant being delivered in a central upper surface portion 93, and with no etchant again being delivered at a trailing perimeter surface portion 94. It will be apparent from the foregoing that perimeter portions of the upper surface of the panel P illustrated in FIG. will have less etchant applied thereto from the nozzles 45,37, resulting in perimeter zones of lesser initial etchant application from nozzles 45,37, and a central zone 96 of greater etchant delivery from nozzles 45,37. It will also be apparent that the schematic illustration of FIG. 4 would be comparable for the lower surface of the panel P.

It will be apparent from the foregoing that various modifications in the details of construction, as well as in the use and operation of the invention may be readily made, all within the spirit and scope of the invention as defined in the appended claims. For example, the blockages 42 could be valves or of any other construction, to separate the supply lines 36 into zones 40 and 41. Similarly, the manner of oscillation of the spray nozzles 37 could vary from that depicted in the present invention. Also, the means for guiding the carriage 97 could be means other than the bushings 73 illustrated. The throttling means could be means other than the needle valves 43 illustrated. It will also be apparent that while the device of the present invention is operative for achieving the desired etchant application to both upper and lower surfaces of a panel P, if desired, such could be applied on only an upper or only a lower surface, if desired Also, equivalents of the various components illustrated could be used in place of the ones described and illustrated herein.

What is claimed is:

1. Apparatus for spray etching panels and the like, comprising:
    (a) chamber means providing a generally confined spray etch chamber with at least one bank of spray nozzles disposed therein and with panel inlet and outlet openings therein;
    (b) panel delivery means for delivering the panels longitudinally through the chamber between an inlet and an outlet openings thereof, in generally horizontal orientation, along a generally horizontal path of travel through the chamber, vertically spaced from at least one bank of nozzles;
    (c) etchant spray means for spraying at least one of an upper and lower surface of the panels with an etchant spray spaced vertically relative to the path of travel, from a bank of nozzles; and
    (d) control means for controlling the amount of etchant spray provided along perimeter portions of at least one of an upper and lower surface of the panels by:

(i) delivering a reduced amount of etchant to side surface portions of at least one of an upper and lower surface of the panels relative to the amount of etchant delivered to center surface portions of panels and (ii) delivering a reduced amount of etchant to leading and trailing surface portions of at least one of an upper and lower surface of the panels relative to the amount of etchant delivered to center surface portion of panels, while the panels pass through the etch chamber between the inlet and outlet thereof.

2. The apparatus of claim 1, where there are both upper and lower banks of nozzles with the said control means for controlling the amount of etchant spray from both upper and lower banks of nozzles.

3. The apparatus of claim 2, including means for pivotally oscillating the spray nozzles transversely of the chamber, to vary the orientation of spray etchant emanating therefrom, transversely of the chamber.

4. The apparatus of claim 2, wherein the control means for controlling by delivering as set forth in clause (d)(i) includes means providing lower pressure of spray etchant to outer spray nozzles along sides of the chamber above and below the path of travel, relative to the pressure of spray etchant provided to inner spray nozzles that are between outer spray nozzles, transversely of the chamber.

5. The apparatus of claim 2, wherein the control means for controlling by delivering as set forth in clause (d)(ii) includes means intermittently delivering spray etchant through first spray nozzles at the inlet to the chamber, relative to the delivery of spray etchant through other nozzles as a panel passes longitudinally through the chamber between inlet and outlet thereof.

6. The apparatus of claim 5, wherein the means intermittently delivering spray etchant includes sensing means for sensing the presence of a panel and means for responsively operating the first spray nozzles in response to the sensing means, to deliver less etchant to the leading and trailing surface portions of the panels as panels pass between chamber inlet and outlet.

7. The apparatus of claim 6, wherein the means for responsively operating includes means for opening and closing the first spray nozzles when the leading, center and trailing surface portions of a panel have reached predetermined locations along the path of travel.

8. The apparatus of claim 2, wherein the control means for controlling by delivering as set forth in clause (d)(i) includes means providing lower pressure of spray etchant to outer spray nozzles along sides of the chamber above and below the path of travel, relative to the pressure of spray etchant provided to inner spray nozzles that are between outer spray nozzles, transversely of the chamber, wherein the control means for controlling by delivering as set forth in clause (d)(ii) includes means intermittently delivering spray etchant through first spray nozzles at the inlet to the chamber, relative to the delivery of spray etchant through other nozzles as a panel passes longitudinally through the chamber between inlet and outlet thereof.

9. The apparatus of claim 8, wherein the means for intermittently delivering spray etchant includes sensing means for sensing the presence of a panel and means for responsively operating the first spray nozzles in response to the sensing, to deliver less etchant to the leading and trailing surface portions of the panels as panels pass between chamber inlet and outlet, wherein the means for responsively operating includes means for opening and closing the first spray nozzles when the leading, center and trailing surface portions of a panel have reached predetermined locations along the path of travel, and including means for pivotally oscillating the spray nozzles transversely of the chamber, to vary the orientation of spray etchant emanating therefrom, transversely of the chamber.

* * * * *